(12) United States Patent
Weigel

(10) Patent No.: US 12,203,989 B2
(45) Date of Patent: Jan. 21, 2025

(54) METHOD AND APPARATUS FOR DETERMINING A SATURATION CHARACTERISTIC OF A SYNCHRONOUS RELUCTANCE MACHINE

(71) Applicant: Siemens Aktiengesellschaft, Munich (DE)

(72) Inventor: Thilo Weigel, Nuremberg (DE)

(73) Assignee: Siemens Aktiengesellschaft, Munich (DE)

( * ) Notice: Subject to any disclaimer, the term of this patent is extended or adjusted under 35 U.S.C. 154(b) by 298 days.

(21) Appl. No.: 17/639,530

(22) PCT Filed: Aug. 5, 2020

(86) PCT No.: PCT/EP2020/072035
§ 371 (c)(1),
(2) Date: Mar. 1, 2022

(87) PCT Pub. No.: WO2021/047832
PCT Pub. Date: Mar. 18, 2021

(65) Prior Publication Data
US 2022/0326306 A1    Oct. 13, 2022

(30) Foreign Application Priority Data
Sep. 12, 2019   (EP) .................................... 19197003

(51) Int. Cl.
*G01R 31/34* (2020.01)
*H02P 25/08* (2016.01)

(52) U.S. Cl.
CPC ............ *G01R 31/343* (2013.01); *H02P 25/08* (2013.01)

(58) Field of Classification Search
None
See application file for complete search history.

(56) References Cited

U.S. PATENT DOCUMENTS

| 8,653,768 B2* | 2/2014 | Stulz | H02P 23/14 |
| | | | 310/49.35 |
| 2004/0046519 A1* | 3/2004 | Leonardi | B60K 6/365 |
| | | | 318/432 |

(Continued)

FOREIGN PATENT DOCUMENTS

| CN | 106602937 A | 4/2017 |
| CN | 107852115 A | 3/2018 |

(Continued)

OTHER PUBLICATIONS

English translation of JP 2002095289 A (Year: 2002).*

(Continued)

*Primary Examiner* — Jermele M Hollington
(74) *Attorney, Agent, or Firm* — Henry M. Feiereisen LLC

(57) ABSTRACT

A method for determining a saturation characteristic of a synchronous reluctance machine includes applying with a pulse inverter a voltage sequence to a stator of the synchronous reluctance machine, wherein the voltage sequence introduces stator fluxes and is applied such that torques acting on a rotor of the synchronous reluctance machine cancel each other out during the application of the voltage sequence. Electrical currents resulting from the stator fluxes are measured and the saturation characteristic is determined based on the stator fluxes and the measured electrical currents.

10 Claims, 6 Drawing Sheets

(56) References Cited

U.S. PATENT DOCUMENTS

| | | |
|---|---|---|
| 2013/0175955 A1 | 7/2013 | Son et al. |
| 2013/0214714 A1* | 8/2013 | Eisenhardt ............ H02P 29/67 |
| | | 318/400.21 |
| 2016/0352276 A1 | 12/2016 | Pramod et al. |
| 2017/0104432 A1 | 4/2017 | Jebai et al. |
| 2017/0179863 A1* | 6/2017 | Lamsahel ............ H02P 29/032 |
| 2017/0366126 A1 | 12/2017 | Sinner et al. |

FOREIGN PATENT DOCUMENTS

| | | | | |
|---|---|---|---|---|
| CN | 110168917 A | | 8/2019 | |
| DE | 102012223441 A1 | | 7/2013 | |
| DE | 102012217787 B3 | * | 12/2014 | ............ G01K 13/00 |
| DE | 102016109777 A1 | | 12/2016 | |
| DE | 102018207004 A1 | * | 11/2019 | ............ H02K 9/197 |
| JP | H1189277 A | | 3/1999 | |
| JP | 2002095289 A | | 3/2002 | |

OTHER PUBLICATIONS

English translation of DE 102012217787 B3 (Year: 2012).*
English translation of DE 102018207004 A1 (Year: 2018).*
PCT International Search Report and Written Opinion of International Searching Authority mailed Aug. 9, 2020 corresponding to PCT International Application No. PCT/ EP2020/072036 filed Aug. 5, 2020.
Hu Jia-Bing et al; "The Zero-speed Sensorless Control for Surface Mounted PMSM Based on the Magnetic-saturation Saliency-effect"; Chinese Journal of Motor Engineering; vol. 26; No. 10; published: May 31, 2006; pp. 152-157.

\* cited by examiner

METHOD AND APPARATUS FOR DETERMINING A SATURATION CHARACTERISTIC OF A SYNCHRONOUS RELUCTANCE MACHINE

CROSS-REFERENCES TO RELATED APPLICATIONS

This application Is the U.S. National Stage of International Application No. PCT/EP2020/072035, filed Aug. 5, 2020, which designated the United States and has been published as International Publication No. WO 2021/047832 A1 and which claims the priority of European Patent Application, Ser. No. 19/197,003.7, filed Sep. 12, 2019, pursuant to 35 U.S.C. 119 (a)-(d).

BACKGROUND OF THE INVENTION

The present invention relates to a method for determining a saturation characteristic of a synchronous reluctance machine. Furthermore, the present invention relates to an apparatus for determining a saturation characteristic of a synchronous reluctance machine.

With regard to the rotor—in principle—synchronous reluctance motors (synRM) have a pronounced direction-dependent distribution of the magnetic conductance or inductance. Usually and according to the prior art, this anisotropy is currently primarily achieved by a direction-dependent material distribution of the soft-magnetic iron in the rotor and by introducing air gaps (flux barriers). As a result, and thus inherent in these motors, is a strongly nonlinear dependence of the magnetic flux on the machine current. In the case of a small current, the flux initially increases steeply. With the onset of saturation in partial areas of the rotor, the increase then flattens, with the steepness and current-dependent flattening being dependent on the direction.

Knowledge of the dependence of the magnetic flux on the current is generally required for operation of the motor control: if a rotor position sensor is present, then at least the amplifications of the current controller must be carried out adaptively at the operating point. For operation with the best possible efficiency, information about the most favorable current operating point depending on the desired torque is required. This too is ultimately surmised from the flux functions. Finally, if the synchronous reluctance motor is to be operated without a rotor position sensor, the saturation functions must also be known in the motor models in order to estimate the rotor position from voltage and current. The determination of the flux functions is therefore an essential and key issue.

In this context, it is known from the prior art that the flux functions are calculated from the FEM data of the machine design. Furthermore, measurement of the flux functions on test stands and by means of measuring programs is known from the prior art. In this case, the test specimen to be measured is equipped with a rotor position sensor and coupled to a drive machine. With an impressed rotational speed, currents can then be impressed in relation to the rotor of the test specimen and the induced stator voltages measured. If the rotational speed (frequency) is known, the stator fluxes can be calculated from the voltages.

It is the object of the present invention to provide a solution as to how the saturation characteristic of a synchronous reluctance machine can be determined more reliably in a simple manner.

SUMMARY OF THE INVENTION

This object is achieved according to the invention by a method and by an apparatus with the features according to the independent claims. Advantageous developments of the invention are specified in the dependent claims.

A method according to the invention serves to determine a saturation characteristic of a synchronous reluctance machine. The method comprises applying a voltage sequence to a stator of the synchronous reluctance machine by means of a pulse inverter. By applying the voltage sequence, stator fluxes are introduced in the stator. The voltage sequence is applied in such a way that torques acting on a rotor of the synchronous reluctance machine cancel each other out during the application of the voltage sequence. In addition, the method comprises the measurement of electrical currents resulting from the stator fluxes. Furthermore, the method comprises determining the saturation characteristic of a rotor on the basis of the stator fluxes and the measured currents.

In the present case, a drive-autonomous determination of the saturation characteristic of the synchronous reluctance machine (synRM) is to be carried out. The synchronous reluctance machine is a three-phase synchronous machine and comprises the stator and the rotor which can be rotated in relation to the stator. The stator may have distributed windings. In particular, the synchronous reluctance machine does not comprise a damper cage. The rotor is magnetically anisotropic in design. In particular, the rotor can have corresponding flux blocking elements, that is to say, air-filled areas, which are arranged in such a way that a direction-dependent magnetic conductance results.

Knowledge and modeling of the non-linear relationship between stator flux and stator current inherent in the synchronous reluctance machine is of crucial importance if the synchronous reluctance machine is to be operated in a robust and performant manner. In particular, this is relevant if the synchronous reluctance machine is to be operated without a rotor position sensor. Two methods are essentially possible for drive-autonomous measurement of the characteristic. According to one method, stator currents can be impressed, and the dependent stator fluxes can be measured via the induced voltages. The problem here is the need for dynamically operating current controllers without exact knowledge of the saturation. According to the inventive method, the stator fluxes are impressed by means of applied voltage sequences and the resulting dependent currents are measured. In this case, the current controllers can be omitted.

In the method, voltage sequences are applied to the stator or to the stator windings. These voltage sequences can each have a plurality of voltage pulses. The pulse inverter can be used to apply the voltage pulses, by means of which voltage space vectors are output. Stator fluxes are impressed into the stator by the voltage sequence or the voltage pulses. Furthermore, the electrical currents resulting from the stator fluxes are measured. The saturation characteristic of the synchronous reluctance machine can then be determined therefrom. This can be derived from the non-linear relationship between the stator fluxes and the stator currents.

It is provided that the voltage sequence or the voltage pulses are output in such a way that the respective torques acting on the rotor cancel each other out. The respective voltage pulses generate a torque which acts on the rotor. The voltage pulses are determined in such a way that the torques resulting from the respective voltage pulses cancel each other out. This means that the rotor position remains unchanged. For this objective, the entire voltage sequence or pulse sequence is defined as a series of short sub-sequences. The method presented is therefore preferably torque-free on average over time. Thus, synchronous reluctance machines can be measured at a standstill with a freely rotatable or locked rotor in the built-in technical application.

With the present invention, the flux functions can be measured autonomously by the drive converter itself and the flux models (tabular or closed) required for the control operation can be identified. In addition, the machine to be measured does not have to be configured with a rotor position sensor or integrated into a test stand with a coupled drive machine. Furthermore, the method is of short measurement duration. Depending on the desired resolution and number of measuring points, a few seconds to a few minutes are required. Overall, the saturation characteristic of the synchronous reluctance machine can thus be determined more reliably in a simple manner.

A position of the rotor is preferably determined before the application of the voltage sequence, and a coordinate system fixed to the stator system is initially aligned with the determined position. Before the start of the actual measurement sequence, the rotor position can first be determined in relation to the electrical axes of the stator using a method according to the prior art. Furthermore, the stator-fixed coordinate system can be initially aligned with this position to trigger the measurement sequence. The rotor position remains unchanged over the subsequent measurement sequence. In this way, the measurements can be carried out precisely.

According to one embodiment it is provided that when the voltage sequence is applied, a plurality of voltage space vectors is output and for each of the voltage space vectors a measured value for the electrical current is determined. A sub-sequence may comprise a short sequence of applied voltage space vectors. The flux pulses can be impressed using switched voltage space vectors of the pulse inverter. The detection of the electrical current or a current measurement value can take place over the duration of a switched zero pointer interval. In the subsequent interval, the current via the freewheeling diodes can be reduced again by a pulse block. Precisely one measurement point result of the dependent current can be determined by the independent flux for each sub-sequence. If the second time integral of the torques acting on the rotor when the pulses are applied disappears over each sub-sequence, then the change in the rotor position is identical to zero.

By means of subsequent interpolation, the dependency ratio can be reversed, and the dependent stator fluxes can be calculated for independently specified support points of the current. When using a closed-form flux model, a parameter estimation method can be carried out subsequently. Depending on the flux model used (closed or tabular), the required model parameters can be calculated downstream of the measurement by means of standard numerical methods, or real-time values required at runtime (for example, flux over current) can be interpolated directly from the measurement tables.

In another embodiment, when the voltage sequence is applied, four voltage space vectors are output. The voltage space vectors can be determined in such a way that the resulting flux pointers are all of the same magnitude. In addition, the voltage space vectors can be determined in such a way that the flux pointers point in four axisymmetric directions. This then results in four torques of likewise constant magnitude and changing signs. It can thus be achieved that the torques cancel one another out.

In another embodiment, eight voltage space vectors are output when the voltage sequence is applied. Under actual conditions, the ideal mechanical equation of motion can influence the friction torque which occurs. This influences the zero balance of the change in position of the rotor or the cancellation of the torques. This effect can be reduced by extending the sub-sequence to eight pulses.

Furthermore, it is advantageous if a pulse duration during which the respective voltage space vectors are output is determined as a function of an estimated deflection of the rotor. Assuming a constantly switched voltage, with negligible saturation, flux and current increase in linear fashion with time. If the saturation is actually considered, the steepness of the current increases over the pulse duration. The torque, as a product of flux and current, thus increases at least quadratically over time. Based on the nominal torque value reached at the end of the pulse, the minimum pulse duration required to impress the nominal flux value and the mechanical nominal start-up time, the resulting position deflection can be estimated via the switched pulse. The penetration of the stator current into the stator flux decreases depending on the frequency. Eddy currents in the stator and rotor iron which are induced in accordance with Lenz's law in such a way that they counteract a change in the flux (transformer effect) are the cause. Compared to quasi-steady-state operation under rotary field conditions, in the case of pulsed excitation the stator current therefore contains additive components which are not coupled with the flux. In order to minimize these effects, the temporal expansion of the pulses must not be made arbitrarily small.

In one embodiment, the voltage sequence is specified in such a way that the resulting stator fluxes are equidistant. According to an alternative embodiment, the voltage sequence can be specified as a function of known saturation characteristics of synchronous reluctance machines. The specification of the independent fluxes per measurement point can take place equidistantly or based on a priori knowledge of typical saturation characteristics of synchronous reluctance machines. For this purpose, in the case of a small amount of flux, the distance of the specifications can initially be selected to be greater and then compressed as the amount of flux increases. This a priori specification results in a more homogenous distribution of the current measured values.

Furthermore, it is advantageous if the currents for a first quadrant of the rotor are determined, and the saturation characteristic is determined on the basis of a known symmetry of the rotor. As a result, for example, the measurement point results of the dependent currents of the specified fluxes over the first quadrant can be available in tabular form. Due to the symmetries that exist in synchronous reluctance machines, these fully describe the saturation characteristic.

The synchronous reluctance machine can then be operated on the basis of the determined saturation characteristic of the rotor. In this case, it is provided in particular that no rotor position sensor is used during the operation of the synchronous reluctance machine.

An apparatus according to the invention is used to determine a saturation characteristic of a synchronous reluctance machine. The apparatus comprises a pulse inverter for applying a voltage sequence to a stator of the synchronous reluctance machine and for impressing stator fluxes. The pulse inverter is designed to apply the voltage sequence in such a way that torques acting on a rotor of the synchronous reluctance machine cancel each other out during the application of the voltage sequence. In addition, the apparatus comprises a measuring facility for measuring electrical currents which result from the stator fluxes. Moreover, the apparatus is designed to determine the saturation characteristic on the basis of the stator fluxes and the measured currents.

In the case of closed flux models, the required algorithms can be implemented inside the drive device or externally. In the case of external implementation, the recorded measurement points are first uploaded to the engineering tool. After the parameters have been estimated, the model parameters are loaded back into the drive. By means of the apparatus or by means of the method, external machines from third-party suppliers can now also be operated without the need for factory measurement in the case of a limited design.

The preferred embodiments presented with reference to the method according to the invention and their advantages apply accordingly to the apparatus according to the invention.

Further features of the invention will emerge from the claims, the figures, and the description of the figures. The features and combinations of features mentioned above in the description and the features and combinations of features mentioned hereinafter in the description of the figures and/or shown alone in the figures can be used not only in the respectively specified combination, but also in other combinations without departing from the scope of the invention.

BRIEF DESCRIPTION OF THE DRAWING

The invention is explained in more detail hereinafter with reference to preferred exemplary embodiments and with reference to the accompanying diagrams. The diagrams show.

DETAILED DESCRIPTION OF PREFERRED EMBODIMENTS

Figure 1:
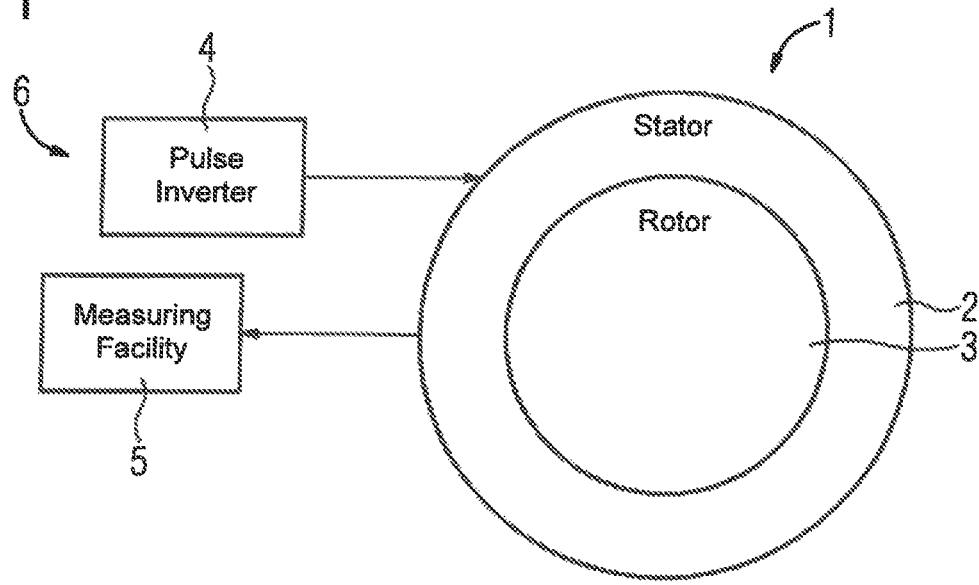
FIG. 1 A diagrammatic view of a synchronous reluctance machine and an apparatus for determining a saturation characteristic of the synchronous reluctance machine.

In the figures, elements which are identical or have identical functions are provided with the same reference characters.

FIG. 1 shows a highly simplified illustration of a synchronous reluctance machine 1 having a stator 2 and a rotor 3. The synchronous reluctance machine 1 can be controlled with a pulse inverter 4.

Synchronous reluctance machines 1 without a damper cage have an inherently non-linear relationship between stator flux and stator current. This saturation characteristic of the synchronous reluctance machine 1 is to be determined in order to operate the synchronous reluctance machine in a robust and performant manner without a rotor position sensor. For this purpose, voltage sequences are applied to a stator 2 of the synchronous reluctance machine with the pulse inverter 4. This results in stator fluxes in the stator 2. Furthermore, electrical currents $i_1$ to $i_4$ resulting from the stator fluxes $\Psi_1$ to $\Psi_4$ are measured. The currents $i_1$ to $i_4$ are measured by means of a measuring facility 5, The saturation characteristic of the synchronous reluctance machines can then be derived therefrom. The measuring facility 5 and the pulse inverter 4 together form an apparatus 6.

First, generation of the voltage sequence or sub-sequence is explained. A sub-sequence may comprise a short sequence of applied voltage space vectors. The torques acting on the rotor 3 are to be determined in such a way that they cancel each other out in the second time integral. The connected voltage space vectors are based on the independently specified flux value as the "generator value". The result of the sub-sequence is the measured value for the current as a function of the specified generator value of the flux. The magnetic symmetries present in the synchronous reluctance machine 1 can be used for the generation of the sub-sequence: the mapping of the stator currents to the stator fluxes and, in reverse, the fluxes to the currents are axisymmetric with respect to the rotor axes.

Figure 2:
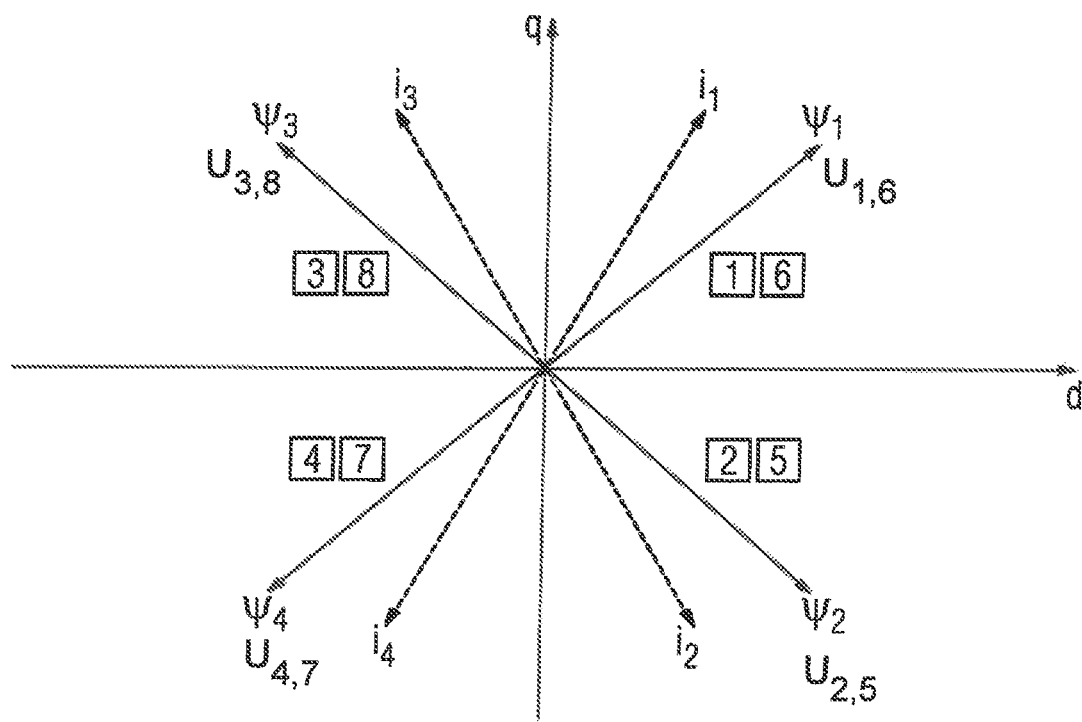
FIG. 2 A diagrammatic view of four flux pointers as a result of voltage pulses which are applied to a stator of the synchronous reluctance machine, and the currents resulting therefrom.

FIG. 2 shows the resulting currents $i_1$, $i_2$, $i_3$, and $i_4$ for four applied flux pointers $\Psi_1$, $\Psi_2$, $\Psi_3$, and $\Psi_4$ which are constantly equal in magnitude and axisymmetric directions. The stator fluxes to $\Psi_1$ to $\Psi_4$ or the flux pointers and the currents $i_1$ to $i_4$ are shown with respect to the axes d and q of the synchronous reluctance machine. With given symmetries, the associated resulting torques $M_1$ to $M_4$ are likewise constantly equal in magnitude and changing sign: $M_1 = M_4 = -M_2 = -M_3$.

Figure 3:
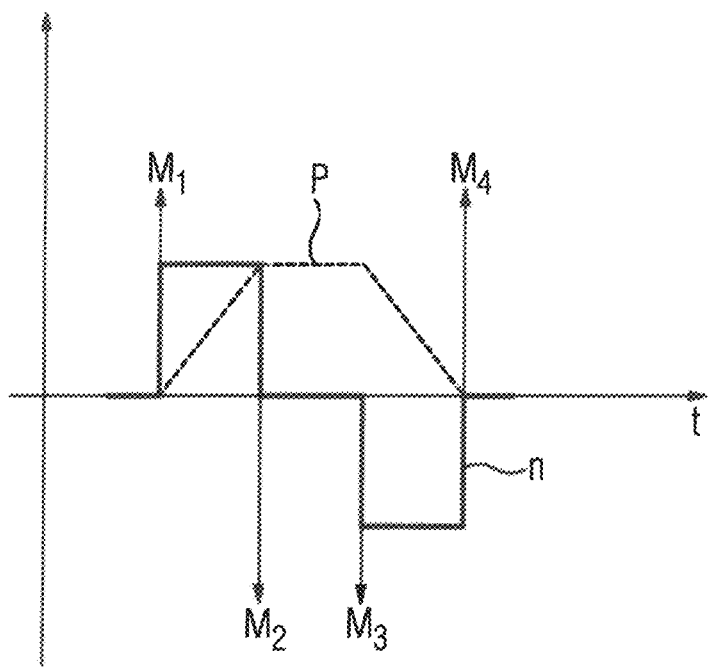
FIG. 3 Torques acting on the rotor of the synchronous reluctance machine with four voltage pulses and the resulting curve of shaft speed and shaft position as a function of time.

In an initially simplified view, the torques $M_1$ to $M_4$ acting on the rotor due to the switched pulses are ideal Dirac pulses. For this purpose, FIG. 3 shows the resulting curve of shaft speed n and shaft position P as a function of time t. With the selected pulse sequence, the double integral of the torque disappears, as required, and with it the change in the position of the rotor.

According to the illustration in FIG. 2, a 4-pulse sub-sequence can be described for measuring the dependence of the current $i_k$ on the flux $\Psi_k$:

$$SEQ4(\Psi_k) := \{\Psi_k, \Psi^*_k, -\Psi^*_k, -\Psi_k\}.$$

The measurement point result from the four current values results in:

$$i_k = \frac{1}{2}(i_{k,1} - i_{k,4}).$$

Under actual conditions, the ideal mechanical equation of motion is "disturbed" by the friction torque which occurs. This influences the zero balance of the change in position.

The two pulses applied in the middle of the sequence also bring about a different magnitude in the torque compared to the edge pulses due to the position deflection that is effective there. By extending the sub-sequence to eight pulses, this effect can be reduced:

$$SEQ8(\Psi_k) := \{\Psi_k, \Psi^*_k, -\Psi^*_k, -\Psi_k, \Psi^*_k, \Psi_k, -\Psi_k, -\Psi^*_k\}.$$

The measurement point result from the eight current measurement values:

$$i_k = \frac{1}{4}(i_{k,1} - i_{k,4} + i^*_{k,5} - i^*_{k,8}).$$

Figure 4:
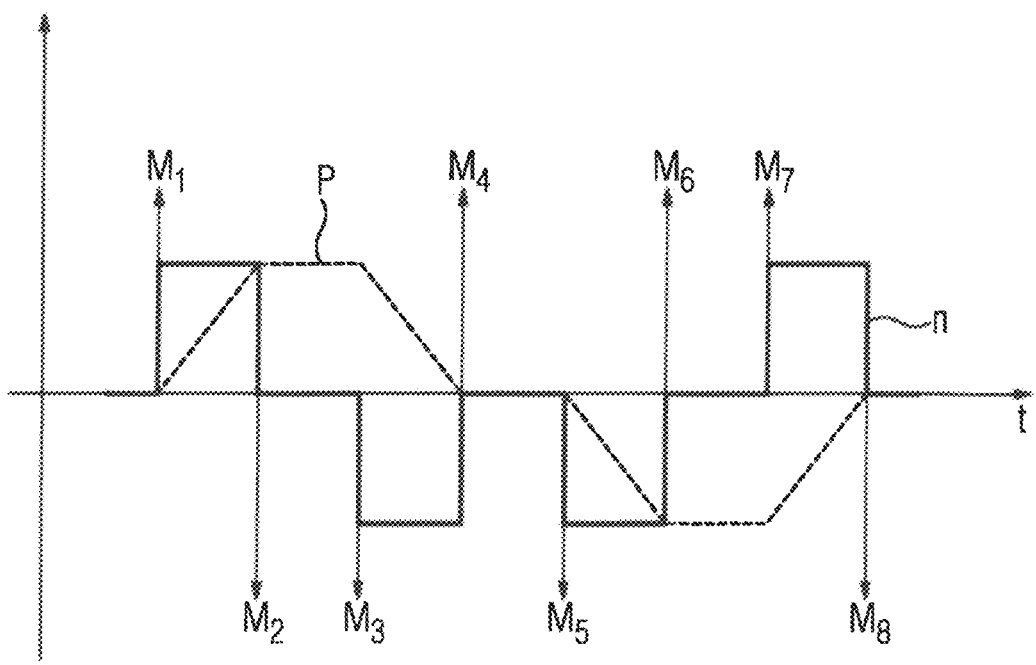
FIG. 4 Torques acting on the rotor of the synchronous reluctance machine with eight voltage pulses and the resulting curve of shaft speed and shaft position as a function of time.

Ideally, the curve of torque shown in FIG. 3 and FIG. 4 results from torques $M_1$ to $M_4$, rotational speed n and position P.

Figure 5:
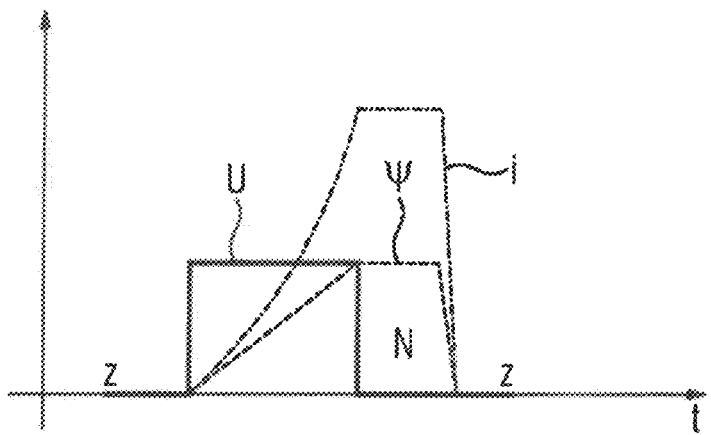
FIG. 5 A time profile of the flux and the current in the case of an applied voltage pulse.

The actually switched pulse durations are considered hereinafter. The flux pulses are impressed by means of the switched voltage space vector U of the pulse inverter, which has a 4-pulse subsequence $U_1$, $U_2$, $U_3$, $U_4$ or an 8-pulse subsequence $U_1$, $U_2$, $U_3$, $U_4$, $U_5$, $U_6$, $U_7$, $U_8$, and is based on the independently specified flux values $\Psi_1$, $\Psi_2$, $\Psi_3$, $\Psi_4$. The current measurement value is recorded over the duration of a switched zero space vector interval N. In the subsequent interval, the current is reduced again via the freewheeling diodes by pulse block z. This can be seen in FIG. 5. Assuming a constantly switched voltage U, with negligible saturation, flux $\Psi$ and current i increase in a linear manner with time t. If the saturation is actually considered, the steepness of the current i increases over the pulse duration. The torque, as a product of flux and current i, thus increases at least quadratically over time t.

Based on the nominal torque value reached at the end of the pulse, the minimum pulse duration required to impress the nominal flux value and the mechanical nominal starting time, the resulting position deflection can be estimated via the switched pulse. The following table shows the mechanical nominal running times $T_{mech}$ and the deflection φ for 50 Hz synchronous reluctance machines of different power $P_n$.

| $P_n$/kW | $T_{mech}$/ms | φ/° |
|---|---|---|
| 0.55 | 90 | 0.33 |
| 3.0 | 82 | 0.37 |
| 15 | 102 | 0.29 |
| 45 | 284 | 0.1 |

If the final value is fixed, the position deflection increases quadratically with the quotient of the pulse duration that is actually applied to the minimum value. The minimum value can be estimated using the reciprocal value of the nominal angular frequency. For 50 Hz machines, this results in a minimum duration of 3.2 ms.

The penetration of the stator current into the stator flux decreases depending on the frequency. The cause is eddy currents in the stator and rotor iron, which are induced according to Lenz's law in such a way that they counteract a change in the flux (transformer effect). Compared to quasi-steady-state operation under rotary field conditions, the stator current with pulsed excitation therefore contains additive components that are not coupled with the flux. In order to minimize these effects, the temporal extension of the pulses must not be made arbitrarily mall. Furthermore, the factor between the two types of measurement can optionally be determined by means of a rotary field reference measurement in a controlled current frequency-impressed operation (I/F operation) under no-load conditions. For this purpose, the same flux is specified in both measurement types and the ratio of the required currents is determined. The saturation characteristic measured in pulse form can be scaled with this factor.

Figure 6:
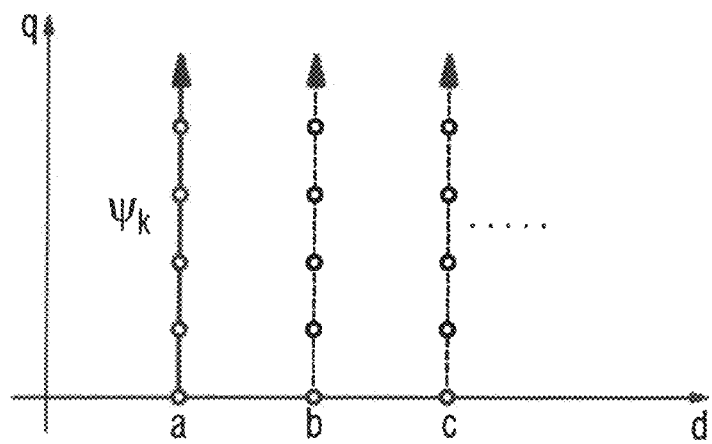
FIG. 6 A diagrammatic view of the specification of flux pulses in the direction of the transverse axis of the rotor on tracks.

Due to the magnetic symmetries, the specification of the flux $\Psi_k$ (generator value of the sub-sequence) over the first quadrant is sufficient for a complete measurement. The specifications can be followed in the direction of the rotor transverse axis on tracks a, b, c and so on. This is illustrated in FIG. 6.

Figure 7:
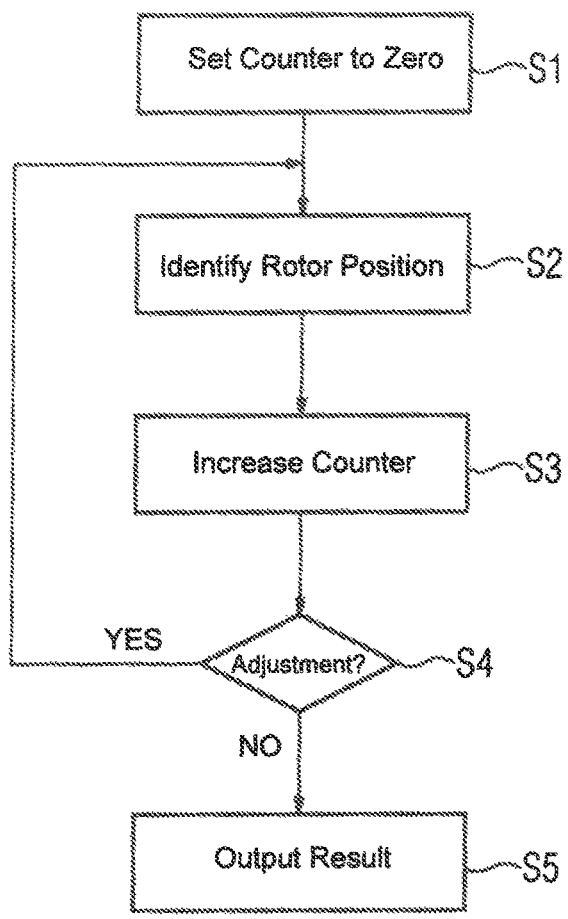
FIG. 7 A diagrammatic flow chart for identifying the rotor position and the adjustment of a coordinate system.

During the measurement sequence, the rotor position can be identified repeatedly if necessary and the comparison of the coordinate system can be updated. This is explained below with reference to the flow chart of FIG. 7. In a step S1, a counter is set to 0 and the first measurement sequence is considered. In a step S2, the rotor position is then identified, and the coordinate system is initialized. In a step S3, the counter is increased, and the subsequent measurement sequence is considered. Here, in a step S4, a check is made as to whether a new adjustment is necessary. If this is the case, the method is continued with step S2; otherwise the measurement is ended, and the result is output in step S5. This result can be output in the form of a table in which the measured values of the flux are entered via the current.

Figure 8:
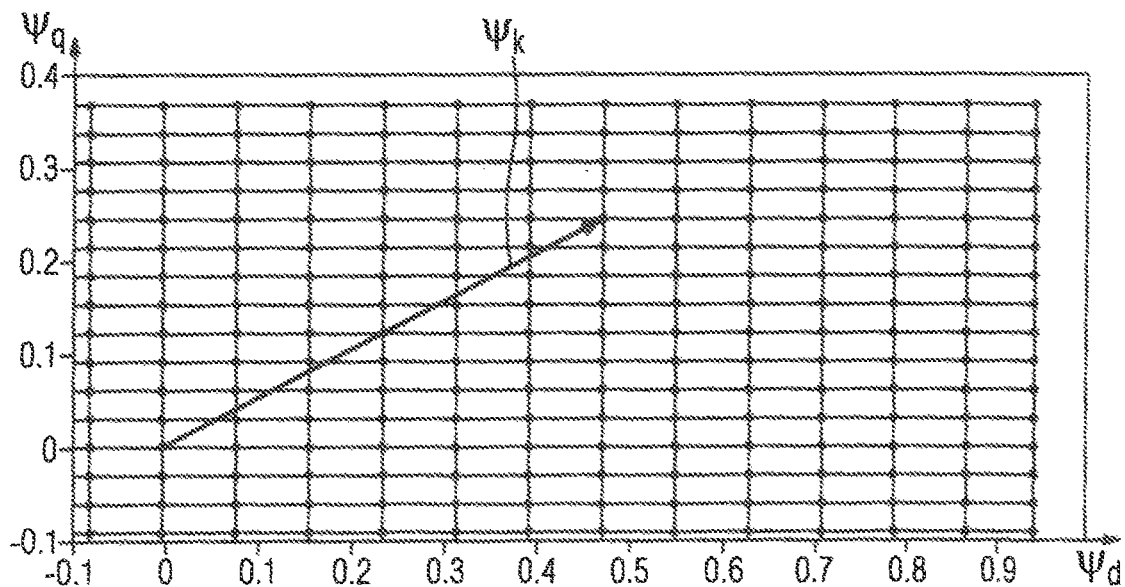
FIG. 8 An equidistant specification of the proportions of the flux with regard to the axes d and q.
Figure 9:
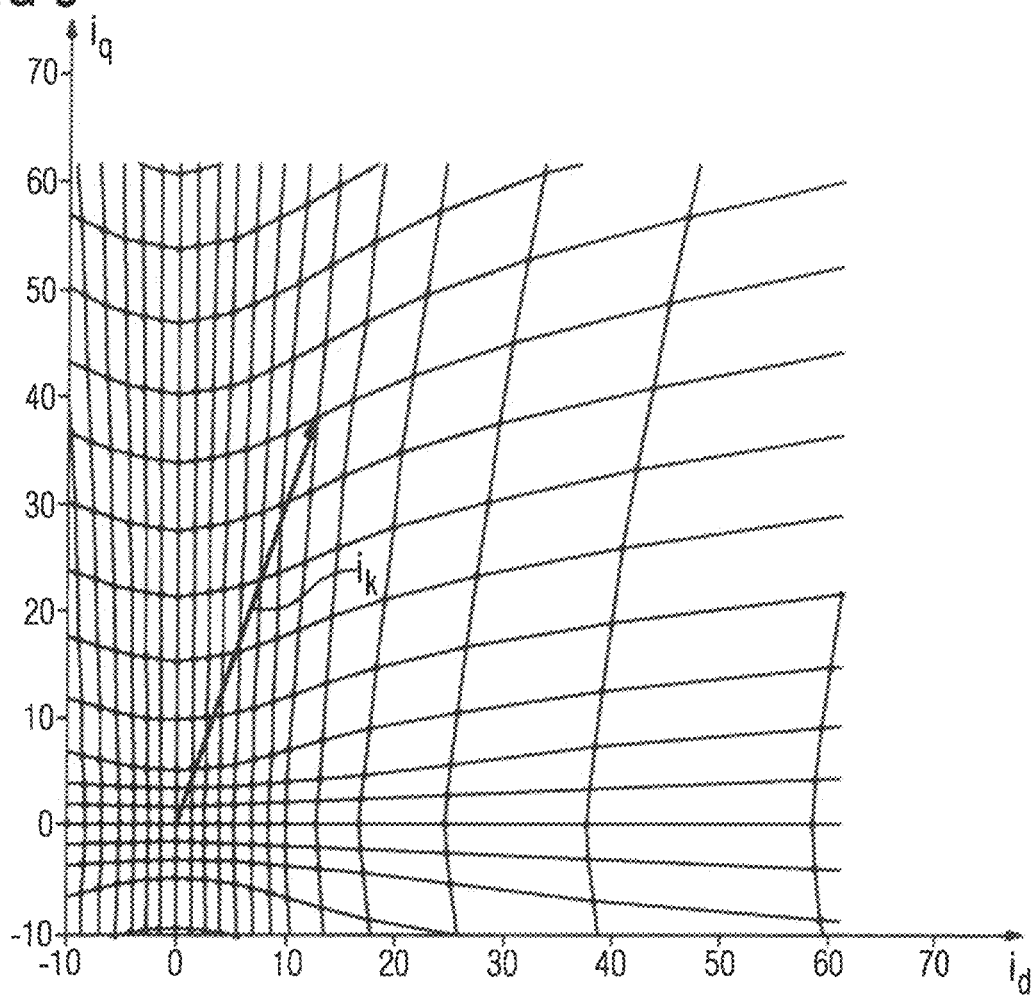
FIG. 9 The resulting mapping of the current measurement values with the specification according to FIG. 8.

The specification of the measuring point distribution can be equidistant. For this purpose, FIG. 8 shows by way of example an equidistant specification of the components of the flux $\Psi_k$ with respect to the axes d and q. FIG. 9 shows the resulting image of the measured current values.

Figure 10:
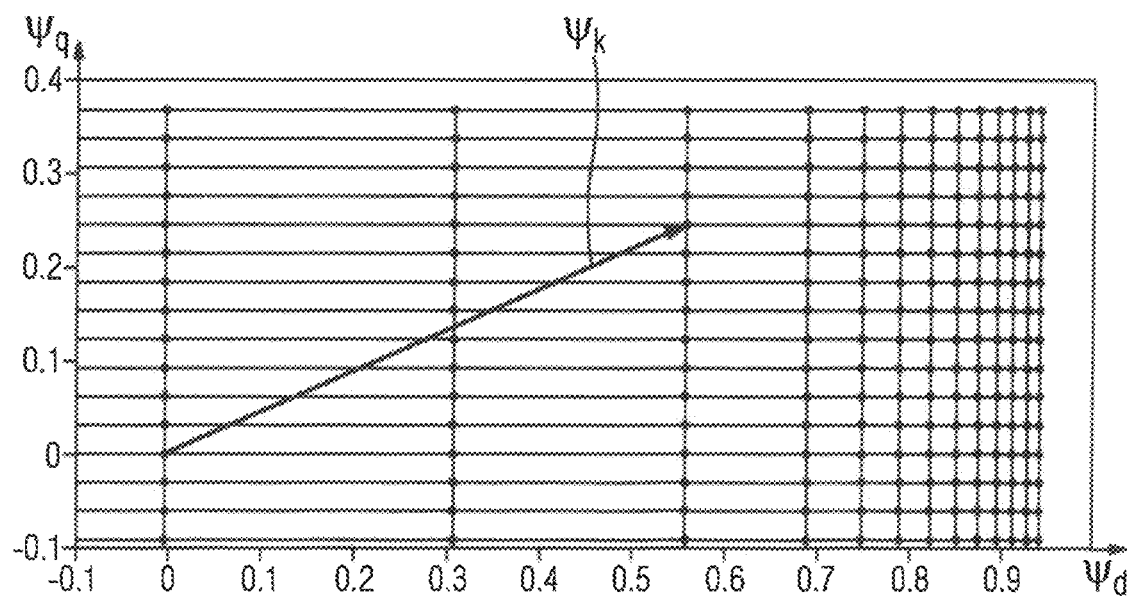
FIG. 10 A specification of the proportions of the flux according to a priori knowledge of typical flux saturation curves.
Figure 11:
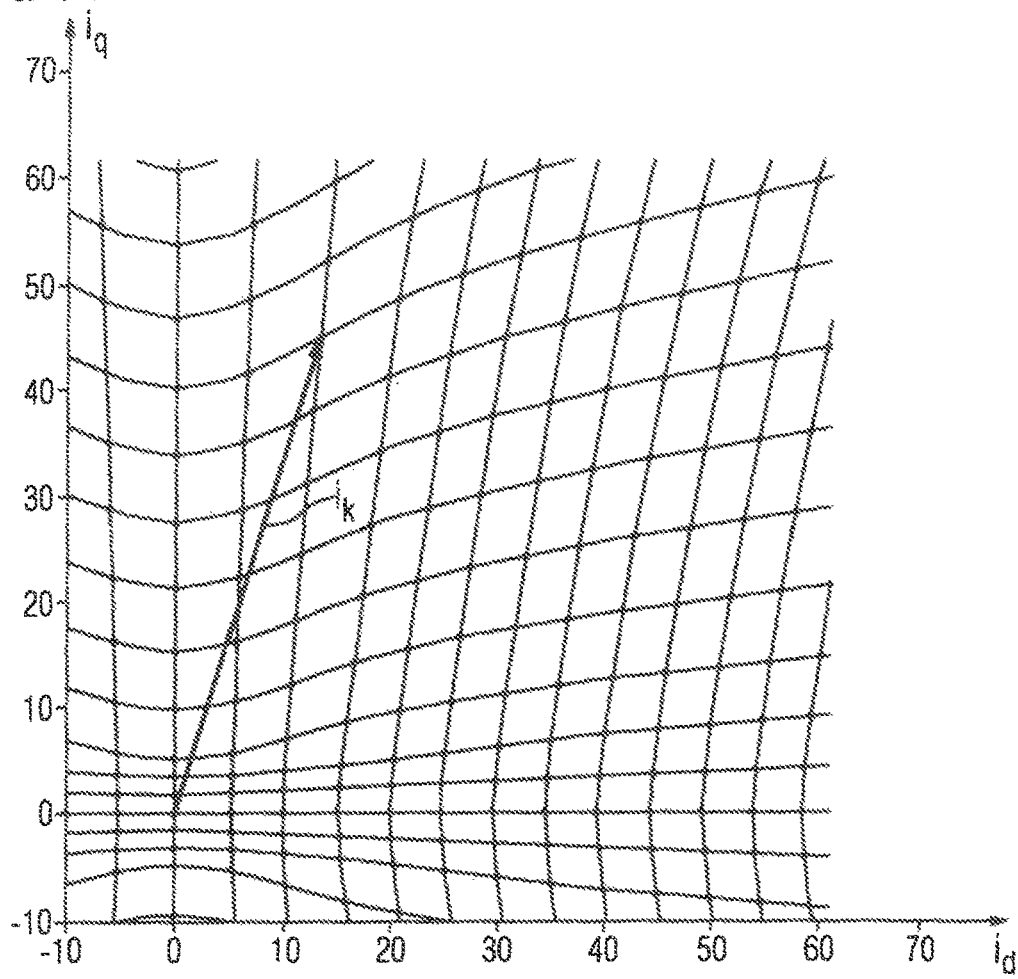
FIG. 11 The resulting mapping of the current measurement values with the specification according to FIG. 10.

Alternatively, the measurement point distribution can be specified based on a priori knowledge of the saturation curves which are typical for synchronous reluctance machines. For this purpose, with a small amount of flux, the distance between the specifications can initially be selected to be larger and then compressed as the amount of flux increases. For this purpose, FIG. 10 shows the specification of the flux pulses based on a priori knowledge of typical d-flux saturation curves. FIG. 11 shows the resulting mapping of the current readings. The a priori specification results in a more homogeneous distribution of the measured current values.

Figure 12:
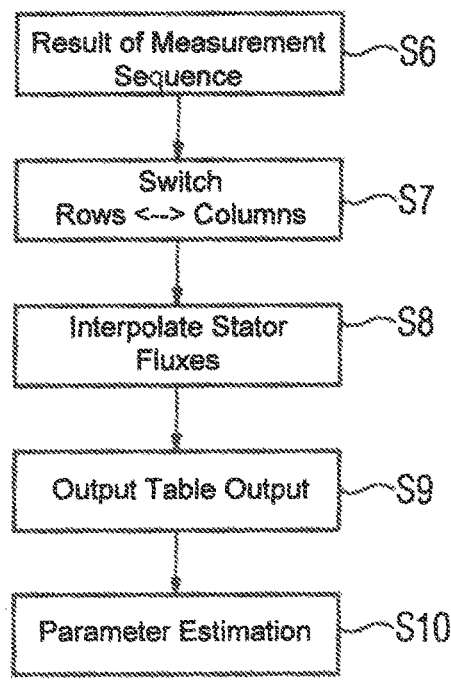
FIG. 12 A diagrammatic flow chart of a method for determining the saturation characteristic of the synchronous reluctance machine.

FIG. 12 shows a diagrammatic flow chart for the determination of the saturation characteristic of the synchronous reluctance machine. The result of the measurement sequence is provided in a step S6. The result of the measurement sequence is the allocation of the independently specified flux to the dependently measured current in tabular form for all points approached. The table can be read or evaluated in both directions. For example, the rows and columns of the table can be reversed in a step S7.

By means of subsequent interpolation of non-equidistantly measured data at any specified support points (according to standard numerical methods), the dependency relationship of the measurement can be reversed, and the respective dependent stator fluxes can be interpolated for the currents (support points) that can now be specified independently (step S8). In a step S9, the tables in which the flux for the support points of the stream is entered can then be output. When using a closed-form flux model, in another step a parameter estimation method can be carried out in a step S10. The interpolation and/or the parameter estimation method can be implemented inside the drive or outside the drive. The algorithms (standard numerical method) can be purchased from third party suppliers or implemented independently.

The invention claimed is:

1. A method for determining a saturation characteristic of a synchronous reluctance machine, comprising:

applying with a pulse inverter a voltage sequence to a stator of the synchronous reluctance machine, with the voltage sequence introducing stator fluxes and being applied such that torques acting on a rotor of the synchronous reluctance machine cancel each other out during the application of the voltage sequence;

measuring electrical currents resulting from the stator fluxes; and determining the saturation characteristic based on the stator fluxes and the measured electrical currents.

2. The method of claim 1, further comprising:

before the application of the voltage sequence, determining a position of the rotor; and initially aligning a stator-fixed coordinate system to the determined position.

3. The method of claim 1, further comprising:

when the voltage sequence is applied, outputting a plurality of voltage space vectors, and determining for each of the voltage space vectors a measured value for the electrical current.

4. The method of claim 3, wherein four voltage space vectors are outputted when the voltage sequence is applied.

5. The method of claim 3, wherein eight voltage space vectors are outputted when the voltage sequence is applied.

6. The method of claim 3, further comprising determining a pulse duration during which the voltage space vectors are outputted as a function of an estimated deflection of the rotor.

7. The method of claim 1, wherein the voltage sequence is specified such that the resulting stator fluxes are equidistant.

8. The method of claim 1, wherein the voltage sequence is specified as a function of known saturation characteristics of the synchronous reluctance machine.

9. The method of claim 1, further comprising:

determining the electrical currents for a quadrant of the rotor, and determining the saturation characteristic based on a known symmetry of the rotor.

10. Apparatus for determining a saturation characteristic of a synchronous reluctance machine, comprising:

a pulse inverter for applying a voltage sequence to a stator of the synchronous reluctance machine and for impressing stator fluxes, wherein the pulse inverter is designed to apply the voltage sequence so that torques acting on a rotor of the synchronous reluctance machine cancel each other out during the application of the voltage sequence; and a measuring facility configured to measure electrical currents resulting from the stator fluxes, wherein the apparatus is configured to determine the saturation characteristic based on the stator fluxes and the measured currents.

* * * * *